(12) United States Patent
Nakamura

(10) Patent No.: US 7,956,532 B2
(45) Date of Patent: Jun. 7, 2011

(54) DISPLAY PANEL, ELECTRONIC DEVICE, AND METHOD OF MAKING DISPLAY PANEL

(75) Inventor: Kazuo Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 480 days.

(21) Appl. No.: 12/075,232

(22) Filed: Mar. 10, 2008

(65) Prior Publication Data
US 2008/0265783 A1 Oct. 30, 2008

(30) Foreign Application Priority Data

Mar. 14, 2007 (JP) ................. P2007-064417

(51) Int. Cl.
*H01J 1/64* (2006.01)
(52) U.S. Cl. .......................... 313/505; 445/24
(58) Field of Classification Search .............. 313/505; 445/24
See application file for complete search history.

(56) References Cited

U.S. PATENT DOCUMENTS

| | | | | |
|---|---|---|---|---|
| 7,038,395 B2 * | 5/2006 | Kato | .................. | 315/169.3 |
| 7,224,118 B2 * | 5/2007 | Yamazaki et al. | ............ | 313/506 |
| 7,479,734 B2 * | 1/2009 | Hamada et al. | ............ | 313/505 |
| 7,521,859 B2 * | 4/2009 | Park | ............... | 313/505 |
| 2002/0079503 A1 * | 6/2002 | Yamazaki et al. | .............. | 257/89 |
| 2004/0256620 A1 * | 12/2004 | Yamazaki et al. | .............. | 257/66 |
| 2005/0116658 A1 * | 6/2005 | Kato | .......................... | 315/169.3 |
| 2005/0200270 A1 * | 9/2005 | Kwak et al. | ................... | 313/502 |

FOREIGN PATENT DOCUMENTS

| | | |
|---|---|---|
| JP | 2002-318555 | 10/2002 |
| JP | 2003-100447 | 4/2003 |
| JP | 2005-019151 | 1/2005 |
| JP | 2005-164679 | 6/2005 |
| JP | 2005-258395 | 9/2005 |

\* cited by examiner

*Primary Examiner* — Peter Macchiarolo
(74) *Attorney, Agent, or Firm* — Robert J. Depke; Rockey, Depke & Lyons, LLC

(57) ABSTRACT

A display panel has a display area with a matrix of individual display pixels. The display panel also includes an electrode that is arranged to cover at least substantially the entirety of the display area. A common electrode is generally frame-shaped and is arranged exclusively around the perimeter of the display area. The common electrode has a notched portion that is located at a power supply lead pattern having a potential that is different from the potential that is applied to the common electrode. The notched portion advantageously substantially reduces the surface area of the common electrode overlapping the power supply lead.

10 Claims, 20 Drawing Sheets

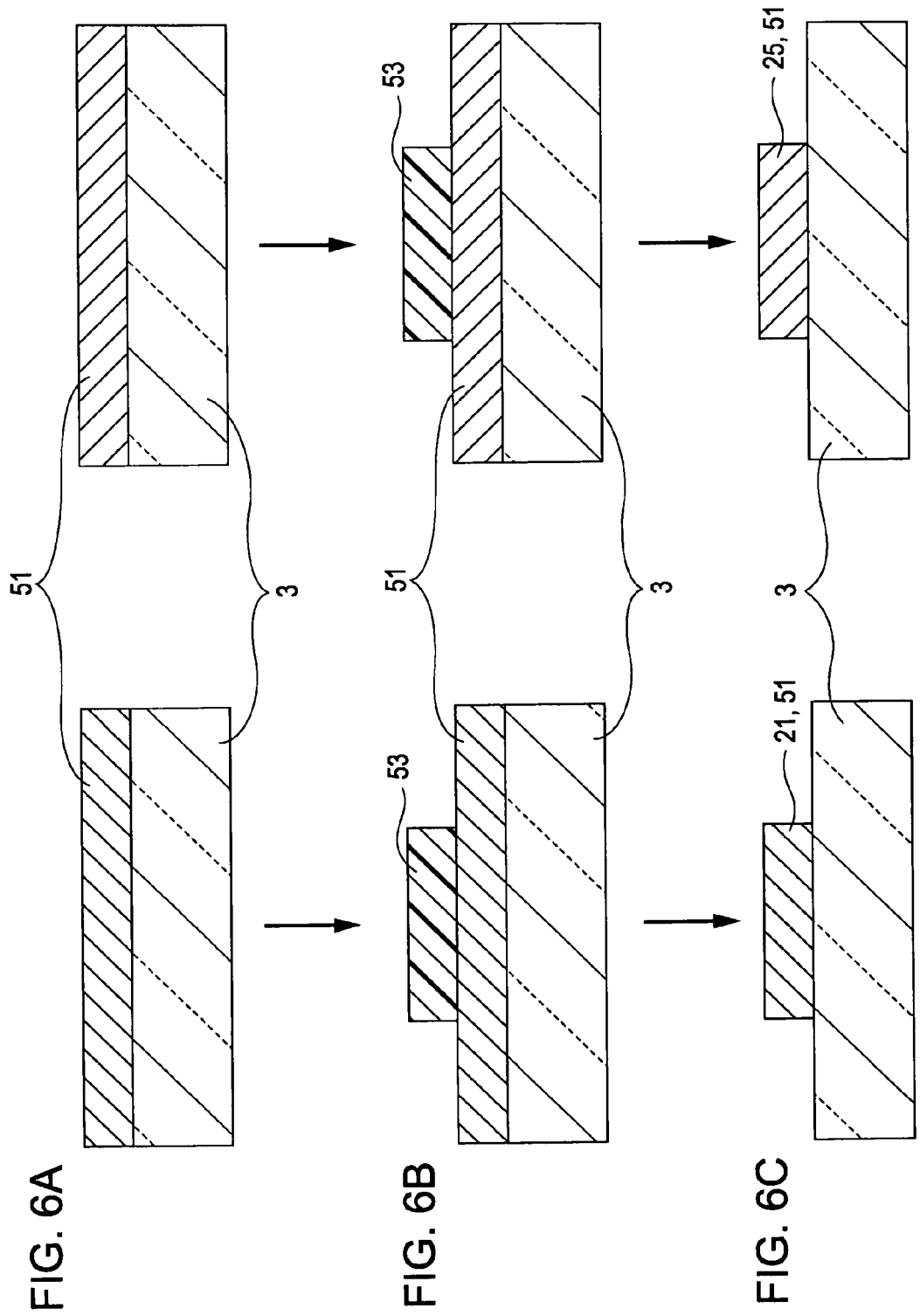

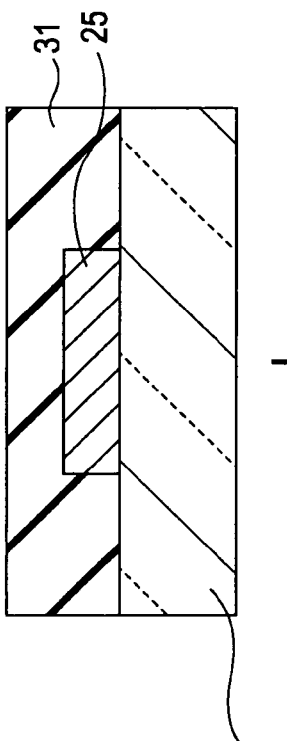
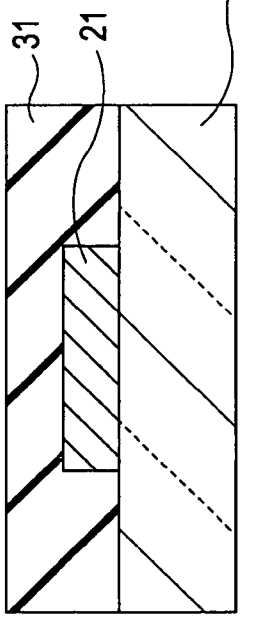
FIG. 7A
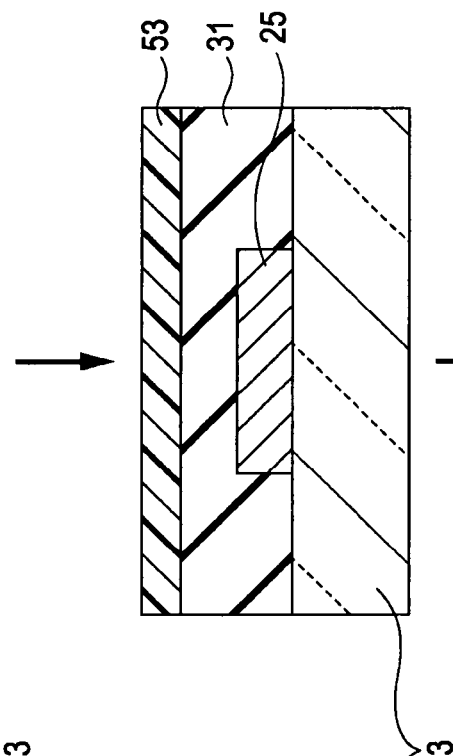
FIG. 7B
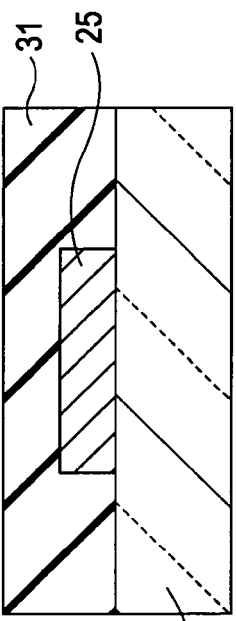
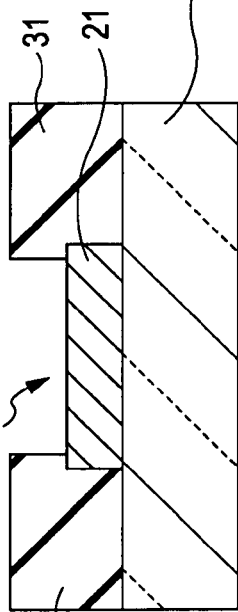
FIG. 7C

DISPLAY PANEL, ELECTRONIC DEVICE, AND METHOD OF MAKING DISPLAY PANEL

CROSS REFERENCES TO RELATED APPLICATIONS

The present invention contains subject matter related to Japanese Patent Application JP 2007-064417 filed in the Japanese Patent Office on Mar. 14, 2007, the entire contents of which are incorporated herein by reference.

BACKGROUND OF THE INVENTION

1. Field of the Invention

The present invention relates to a technique of reducing the probability of occurrence of a short circuit between power supplies in a display panel having a display area with a matrix array of display elements.

The present invention relates to a display panel, an electronic device, and a method of making the display panel.

2. Description of the Related Art

Recently, flat panel displays (FPDs) have remarkably become widespread. Displays of various types are proposed along with the widespread use of FPDs. In the current FPD field, liquid crystal displays (LCDs) are predominantly used.

LCDs, which are not self-light-emitting devices, need additional components, such as a backlight and a polarizer. Accordingly, the LCDs have disadvantages in that it is difficult to reduce the thickness and the brightness tends to degrade.

In contrast, organic electroluminescent (EL) displays, which are self-light-emitting devices, need no additional components, such as a backlight, in principle. Advantageously, a reduction in thickness and an increase in brightness of the organic EL displays are easier than those of the LCDs.

In particular, active-matrix organic EL displays in which a drive circuit (switching element) is provided for each display pixel have advantages in that low current consumption can be achieved because each display pixel can hold light emission.

The active-matrix organic EL displays further have advantages in that the displays having a large screen and those having a high-definition screen can be relatively easily realized. Accordingly, the active-matrix organic EL displays are expected to enter the mainstream of next-generation FPDs.

FIG. 1 illustrates the structure of a panel of an organic EL display.

The organic EL display, indicated at 1, includes a glass substrate 3 as a base substrate. The upper surface of the glass substrate 3 has a display area 5 with a matrix array of display pixels. The display pixels are driven by active matrix driving.

Scan-signal supply TABs 7, video-signal supply TABS 9, and power supply TCPs 11 are connected to the glass substrate 3 so as to surround the display area 5. The scan-signal supply TABS 7 are used to supply signals for controlling a video-signal write operation and a light emission operation on the display pixels.

The video-signal supply TABs 9 are used to supply video signals for the display pixels. The power supply TCPs 11 are used to supply drive power.

In addition, a cathode layer is arranged on the upper surface of the display area 5 so as to cover the whole of the display area 5 (or an organic-layer deposition area 13). The organic-layer deposition area 13, serving as a range where an organic material for a luminous layer is deposited, is slightly larger than the display area 5.

A cathode-layer deposition area 15, which provides a maximum area for cathode layer formation, is larger than the organic-layer deposition area 13 by approximately 1 to 2 mm in each side. The cathode layer is held at 0 V by a cathode common electrode 17, indicated by a hatched portion in FIG. 1, electrically connected to the cathode layer in the periphery of the cathode-layer deposition area 15.

Those deposited layers are coated with a sealing compound (not shown) and the sealing compound is then overlaid with a sealing glass, thus constructing the organic EL display 1.

FIG. 2 is an enlarged view of related-art arrangement in the vicinity of the power supply TCP in the organic EL display 1. A cathode power supply pad supplies-cathode power to a cathode power supply lead pattern 21.

The cathode power supply lead pattern 21 is connected to the cathode common electrode 17 via a contact 23. The cathode common electrode 17 is frame-shaped so as to be arranged along the periphery of the display area 5 and is electrically connected to the cathode layer deposited in the cathode-layer deposition area 15.

An anode power supply lead pattern 25 is connected to an anode power supply pad. The anode power supply lead pattern 25 is a metallization pattern underlying the cathode common electrode 17 and is connected to the display pixels in the display area.

FIG. 3 illustrates the cross section of part where the cathode common electrode 17 overlaps the anode power supply lead pattern 25. In other words, FIG. 3 is a cross-sectional view taken along the line A-A in FIG. 2.

The anode power supply lead pattern 25 is arranged on the upper surface of the glass substrate 3 and is covered with a protective layer 31.

The protective layer 31 is overlaid with a planarizing layer 33, which is covered with the cathode common electrode 17.

The cathode common electrode 17 is coated with the sealing compound indicated at 35. The sealing compound 35 is covered with the sealing glass indicated at 37. The above-described layered structure is of a general type.

Related-art organic EL displays are disclosed in Japanese Unexamined Patent Application Publication Nos. 2005-164679, 2005-19151, and 2003-100447.

SUMMARY OF THE INVENTION

Related-art layered structures have the following disadvantages: Generally, the anode power supply lead pattern 25 arranged below the cathode common electrode 17 needs an enough width (for example, approximately 3 to 5 mm) to alleviate a reduction in potential upon driving.

This leads to an increase in the area of overlap between the cathode common electrode 17 and the anode power supply lead pattern 25.

Unfortunately, the large area of overlap therebetween means increasing the probability of occurrence of a short circuit between power supplies due to poor resistance to pressure which may be caused by a pin hole, formed by dust, in the protective layer 31 or the planarizing layer 33 between the cathode common electrode 17 and the anode power supply lead pattern 25.

Such a phenomenon tends to occur especially in large panels and becomes a serious problem for products. In many cases, the large panels use amorphous silicon transistors as driving elements. The use of amorphous silicon transistors also contributes to the above-described phenomenon.

The amorphous silicon transistors have advantages in that they are easier to make than polycrystalline silicon transistors and variations in characteristics in the substrate are relatively small. Unfortunately, the amorphous silicon transistors have disadvantages in that its drive capability is small. In order to compensate for the small drive capability, a relatively large voltage of approximately 25 V is needed as a voltage applied between anode and cathode.

Since organic EL elements are current-driven type luminescent elements that emit light by current flowing therethrough, the capacity of anode power supply and that of cathode power supply have to increase as increasing the number of pixels and the panel size.

Therefore, the occurrence of a short circuit between the power supplies may be a fatal defect. Increasing the thickness of an interlayer insulating layer is effective in reducing the probability of occurrence of a short circuit therebetween. However, this approach is not practical because changing the thickness of the interlayer insulating layer involves changing a process of making the display panel.

It is desirable to provide a display panel in that the probability of occurrence of a short circuit between power supplies can be reduced without changing a process of making the display panel and a method of making the display panel.

An embodiment of the present invention provides a display panel having a display area with a matrix array of display pixels, the display panel including a common electrode having a notch arranged in a particular portion.

In this embodiment, the common electrode is electrically connected to an electrode arranged so as to cover the whole of the display area. The common electrode is frame-shaped and is arranged along the periphery of the display area.

In the common electrode, the notch is arranged over a power supply lead pattern to which a potential different from that applied to the common electrode is applied.

According to this embodiment of the present invention, the area of overlap between the common electrode and the power supply lead pattern, to which a potential different to that applied to the common electrode is applied, can be minimized.

Minimizing the overlap area enables sufficient resistance to pressure to be held even when a pin hole caused by dust occurs, thus reducing the probability of occurrence of a short circuit between power supplies. As the area of the notch increases (i.e., the overlap area decreases), the probability of occurrence of a short circuit between power supplies generally decreases. Advantageously, the yield of the display panel can be increased by the decrease in the probability of occurrence.

BRIEF DESCRIPTION OF THE DRAWINGS

FIGS. 6A to 6C are diagrams explaining a process of making a display panel, FIGS. 6A to 6C including the cross sections of parts near the power supply pads;

FIGS. 7A to 7C are diagrams explaining the process of making the display panel, FIGS. 7A to 7C including the cross sections of the parts near the power supply pads;

DESCRIPTION OF THE PREFERRED EMBODIMENTS

A display panel according to an embodiment of the present invention will be described below.

In the following description, components which are not illustrated or described in the present specification are those to which a known or well-known technique in the art is applied.

Embodiments which will be described below are implementations of the present invention. The present invention is not restricted to the embodiments.

(A) Organic EL Display
(A-1) Panel Structure

Figure 1:
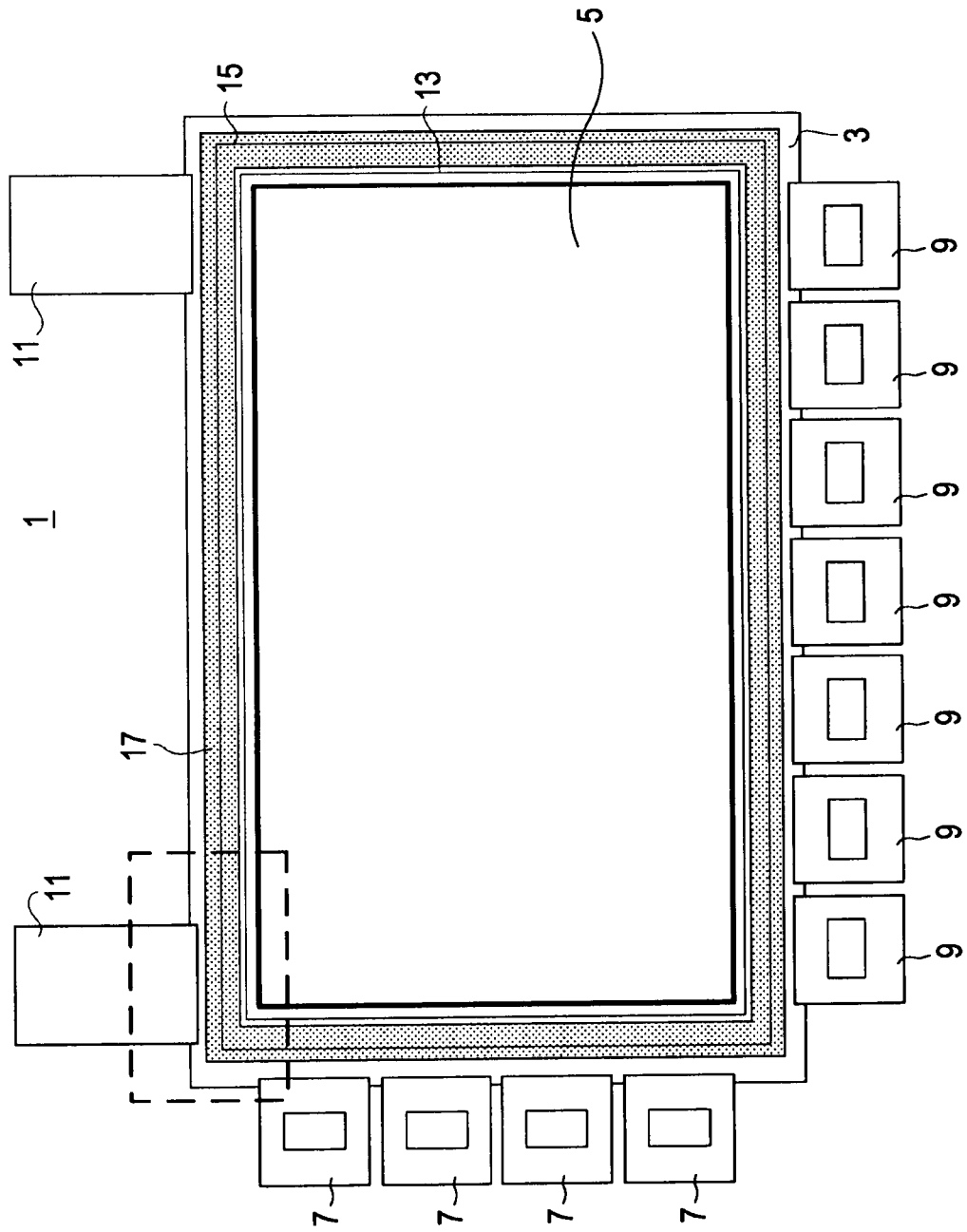
FIG. 1 is a diagram illustrating a general panel structure of an organic EL display.

The fundamental structure of an organic EL display according to the present embodiment is the same as that shown in FIG. 1, except for the arrangement in the vicinity of the power supply TCPs 11. Accordingly, a difference will now be described below.

Figure 2:
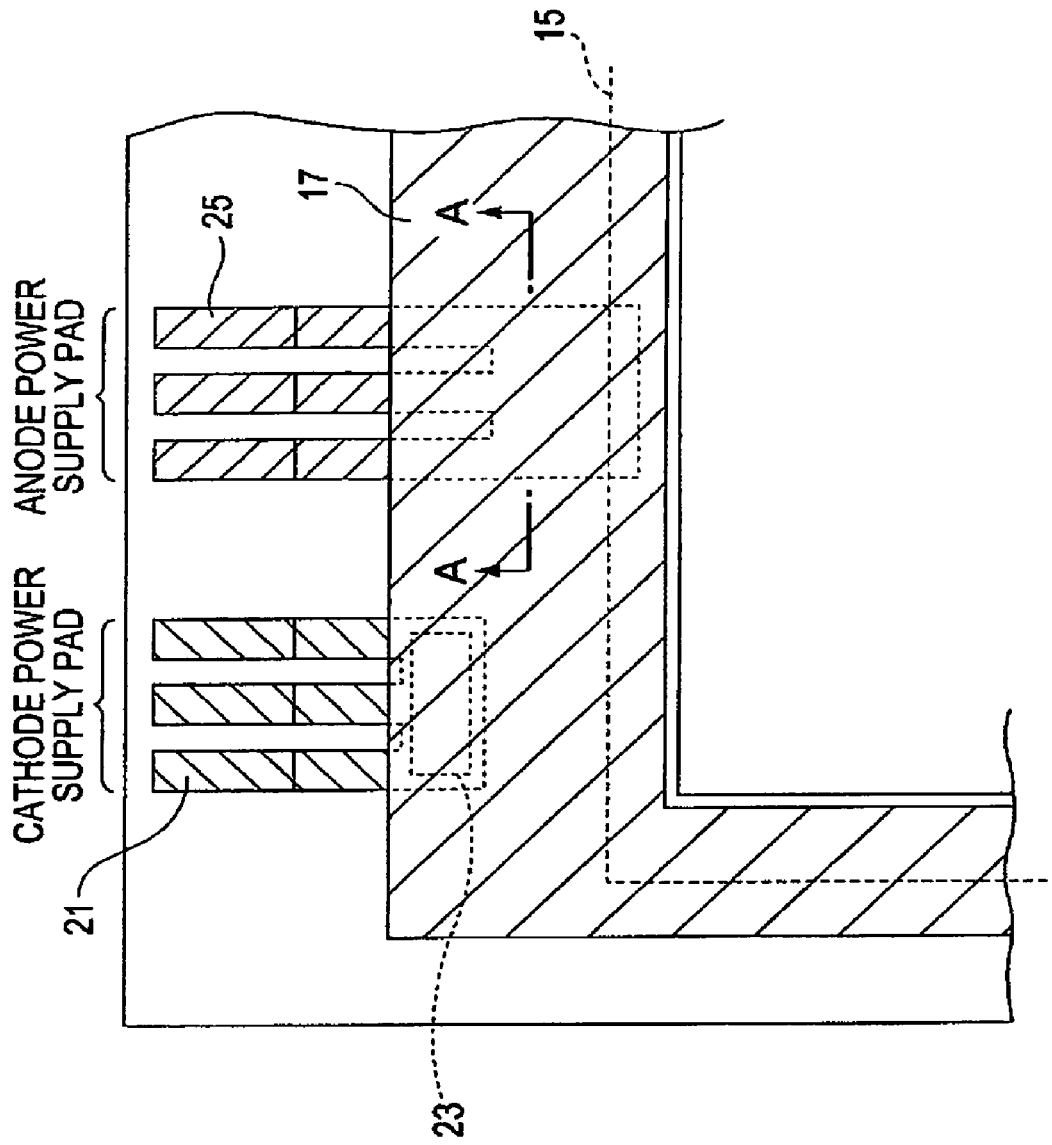
FIG. 2 is a plan view of related-art arrangement in the vicinity of power supply pads.
Figure 4:
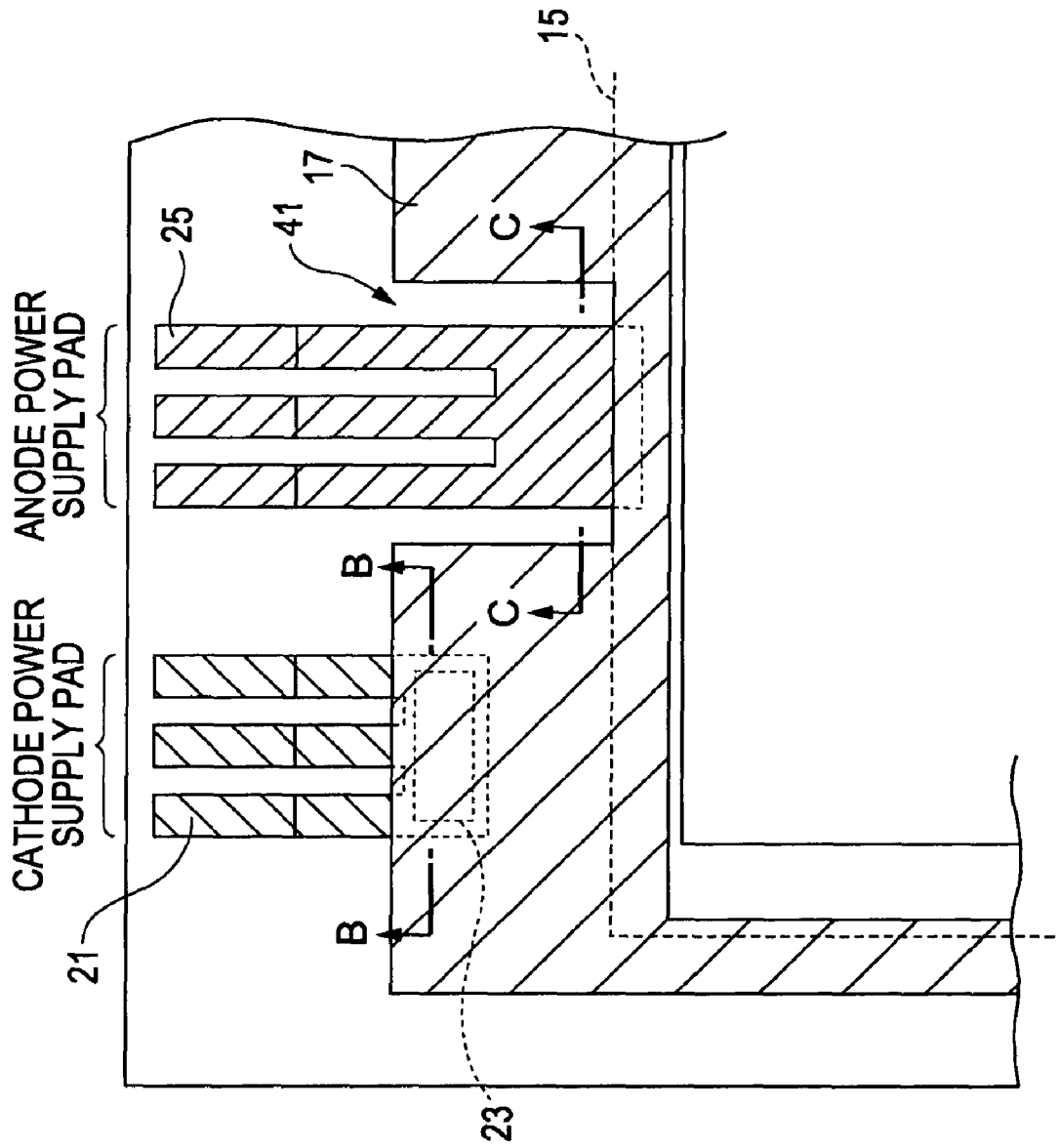
FIG. 4 is a plan view of arrangement in the vicinity of power supply pads according to an embodiment of the present invention.

FIG. 4 is a plan view of arrangement specific to the present embodiment. In FIG. 4, the same components as those in FIG. 2 are designated by the same reference numerals.

In the present embodiment, a cathode common electrode 17 has a rectangular notch 41 that is opposed to an anode power supply lead pattern 25.

The width of the notch 41 is larger than that of the anode power supply lead pattern 25. The depth of the notch 41 is set such that the bottom of the notch 41 reaches the periphery of a cathode-layer deposition area 15. Accordingly, the width of the cathode common electrode 17 in the notch 41 is substantially the same as that of the area of overlap between the cathode common electrode 17 and the cathode layer.

Figure 3:
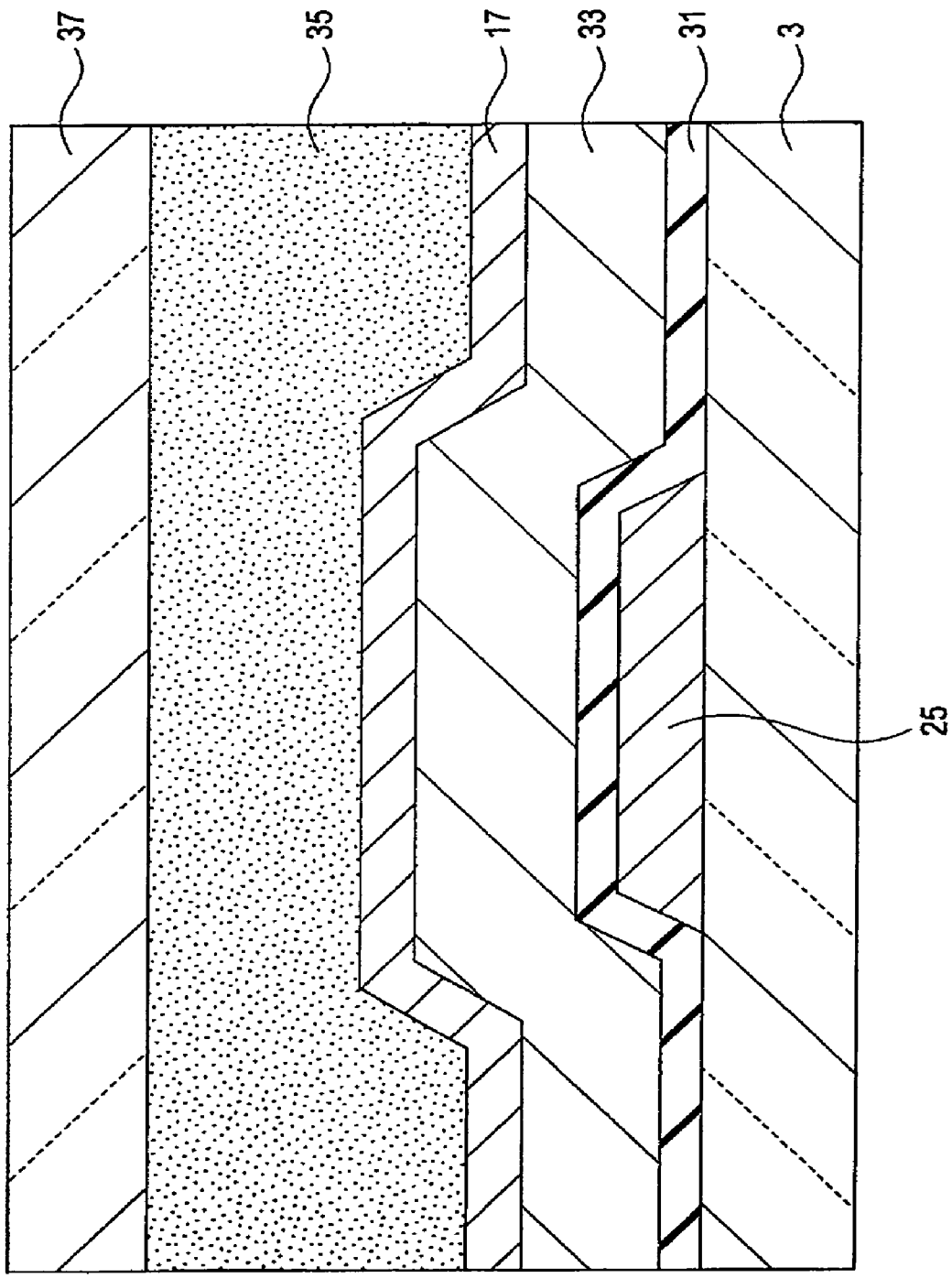
FIG. 3 is a cross-sectional view of part, where a cathode common electrode overlaps an anode power supply lead pattern, in the related art arrangement.
Figure 5:
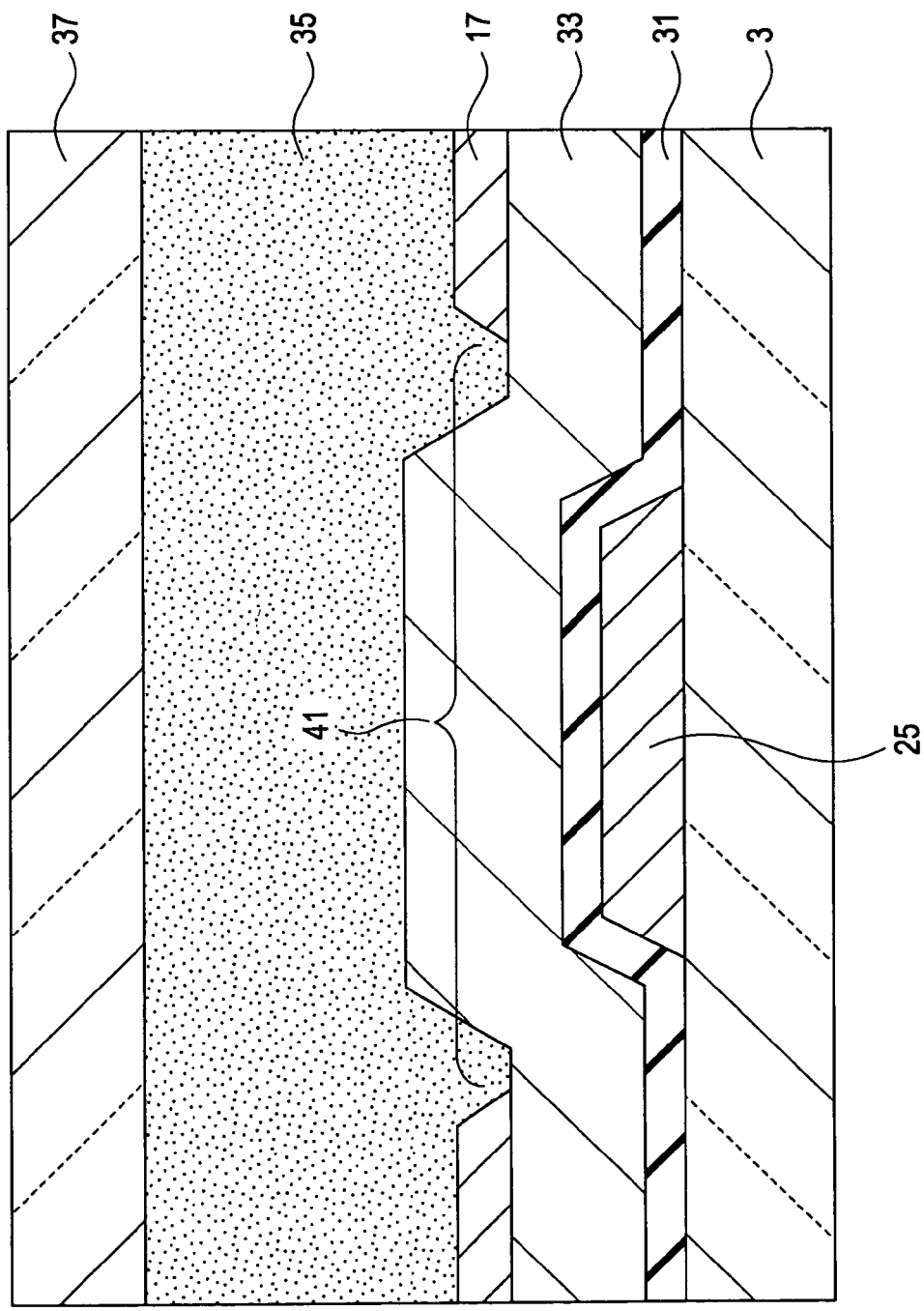
FIG. 5 is a cross-sectional view of part, where a cathode common electrode is removed above an anode power supply lead pattern, in the embodiment of the present invention.

FIG. 5 illustrates the cross section of part where the cathode common electrode 17 is removed above the anode power supply lead pattern 25. In other words, FIG. 5 is a cross-sectional view taken along the line C-C in FIG. 4. In FIG. 5, the same components as those in FIG. 3 are designated by the same reference numerals.

Referring to FIG. 5, in the part where-the notch 41 is arranged, there is no cathode common electrode 17 above the anode power supply lead pattern 25. The cross section of this part is common to another part where the anode power supply lead pattern 25 is arranged in the vicinity of the cathode-layer deposition area 15.

In the present embodiment, therefore, the area of overlap between the anode power supply lead pattern 25 and the cathode common electrode 17 with interlayer insulating layers therebetween can be remarkably reduced.

Advantageously, if a pin hole occurs in an interlayer, a short circuit between the power supplies can be remarkably minimized.

(A-2) Method of Making Display Panel

A method of making the display panel with the above-described structure will be explained below with reference to FIGS. 6A to 11. FIGS. 6A to 11 illustrate the cross sections (taken along the line B-B of FIG. 4) of part where a cathode power supply lead pattern 21 is arranged and the cross sections (taken along the line C-C of FIG. 4) of part where the anode power supply lead pattern 25 is arranged.

First, a metallic layer 51 for lead patterning is formed on the upper surface of a glass substrate 3 (FIG. 6A).

Subsequently, the metallic layer 51 is coated with a resist 53 and the resist 53 is then patterned for formation of lead patterns (FIG. 6B).

After that, the resist 53 and part of the metallic layer 51 are removed by etching. Consequently, only the metallic layer 51 underlying the resist 53 is remained on the glass substrate 3, thus forming the cathode power supply lead pattern 21 and the anode power supply lead pattern 25 (FIG. 6C).

A protective layer 31 is then arranged so as to cover the lead patterns and the glass substrate 3 (FIG. 7A).

After that, the protective layer 31 is coated with the resist 53 and the resist 53 is then patterned for formation of a contact 23 (FIG. 7B). Since the contact 23 is provided for the cathode power supply lead pattern 21, an opening 55 is arranged only in a region including the line B-B in FIG. 4.

After that, the resist 53 and part of the protective layer 31 are removed by etching. Consequently, only the protective layer 31 under the opening 55 is removed, thus forming an opening 57 for the contact 23 (FIG. 7C).

Figures 8A, 8B:
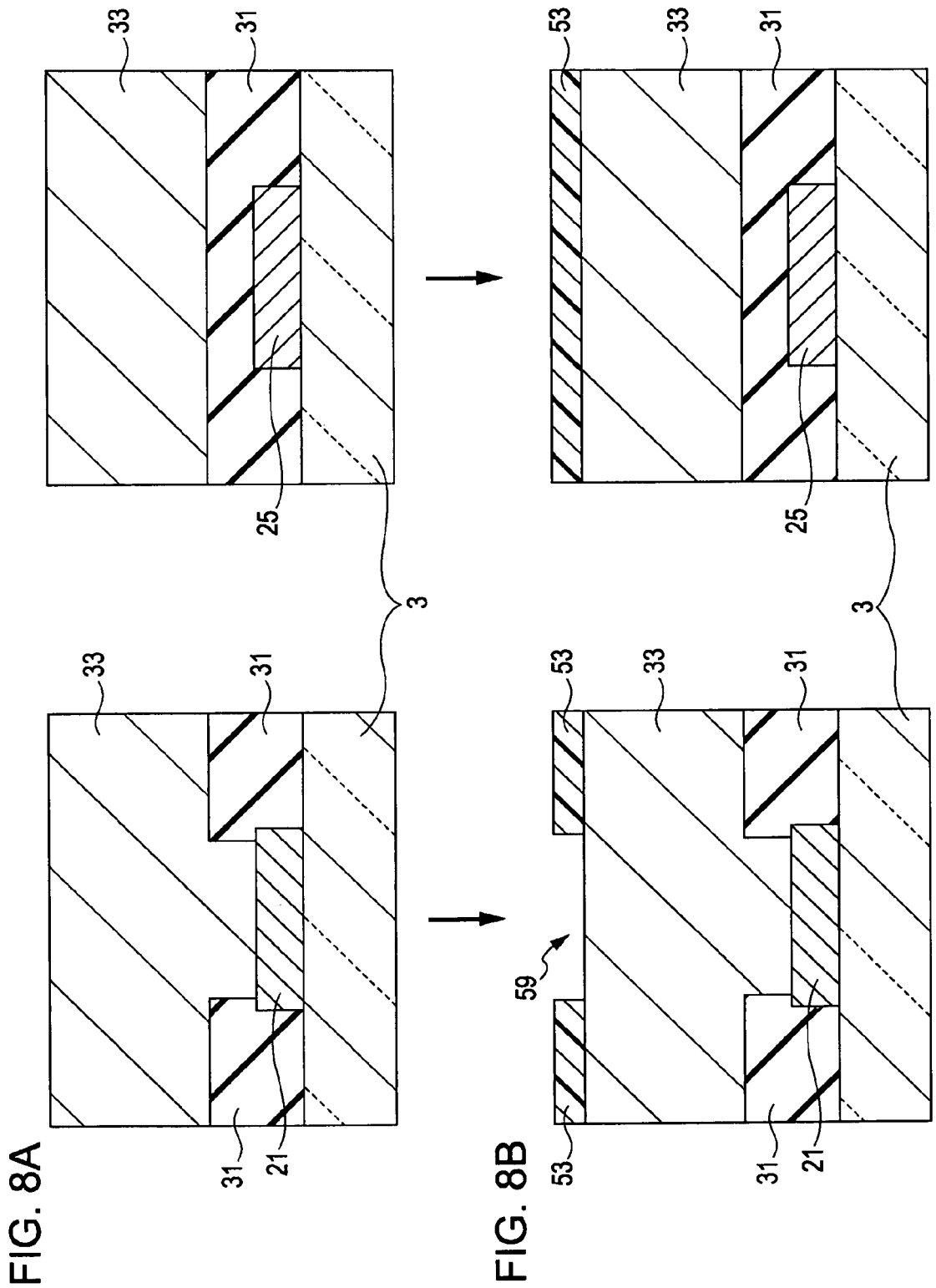
FIGS. 8A and 8B are diagrams explaining the process of making the display panel, FIGS. 8A and 8B including the cross sections of the parts near the power supply pads.

Subsequently, a planarizing layer 33 is arranged so as to cover the protective layer 31 and the cathode power supply lead pattern 21 (FIG. 8A).

After that, the planarizing layer 33 is coated with the resist 53 and the resist 53 is patterned for formation of the contact 23 (FIG. 8B). Since the contact 23 is provided for the cathode power supply lead pattern 21, an opening 59 is arranged in a region including the line B-B in FIG. 4.

After that, the planarizing layer 33 and the protective layer 31 under the opening 59 are removed by etching. Consequently, a hole 61 that reaches the cathode power supply lead pattern 21 is formed so as to downwardly extend from the opening 59 (FIG. 9A).

Figures 9A, 9B:
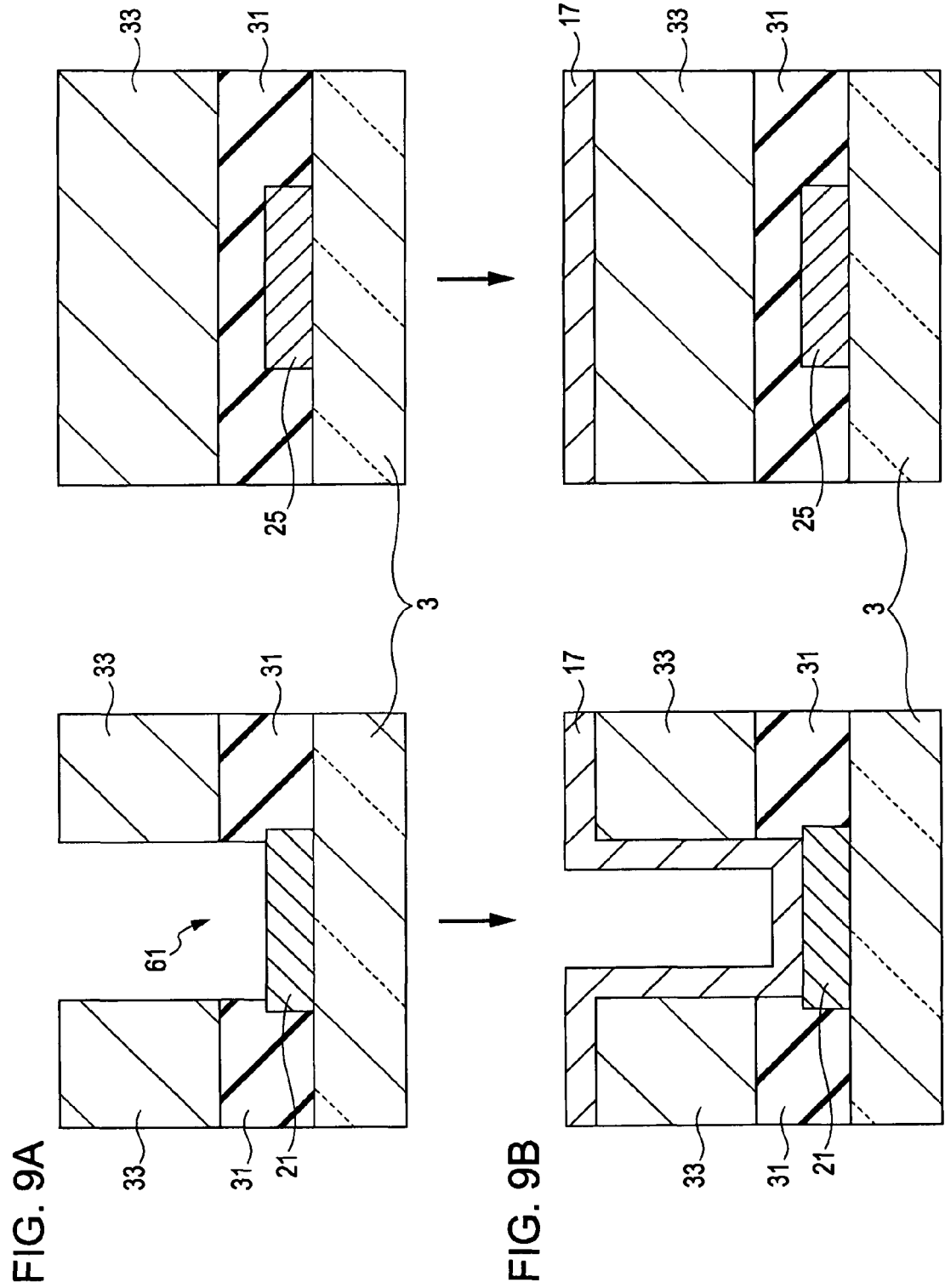
FIGS. 9A and 9B are diagrams explaining the process of making the display panel, FIGS. 9A and 9B including the cross sections of the parts near the power supply pads.

Subsequently, the cathode common electrode 17 is formed by vapor deposition (FIG. 9B). The cathode common electrode 17 is arranged in the periphery of the display area 5 so as to be frame-shaped. The cathode common electrode 17 is arranged uniformly on the surface including side walls of the hole 61. The hole 61 corresponds to the contact 23.

Figure 10:
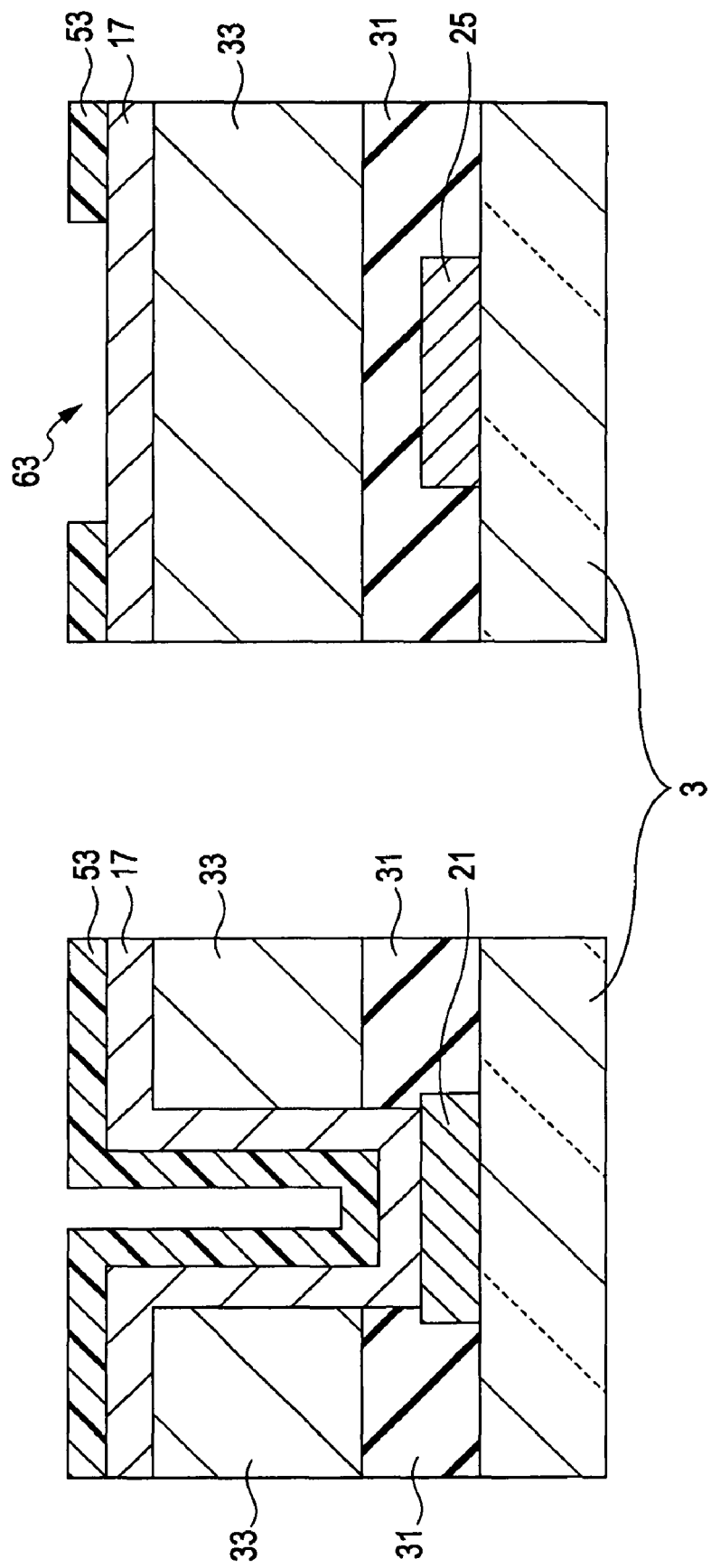
FIG. 10 explains the process of making the display panel and includes the cross sections of the parts near the power supply pads.

After that, the cathode common electrode 17 is coated with the resist 53 and the resist 53 is patterned for formation of the notch 41 (FIG. 10). Since the notch 41 is arranged only above the anode power supply lead pattern 25, an opening 63 is arranged only in a region including the line C-C in FIG. 4.

Figure 11:
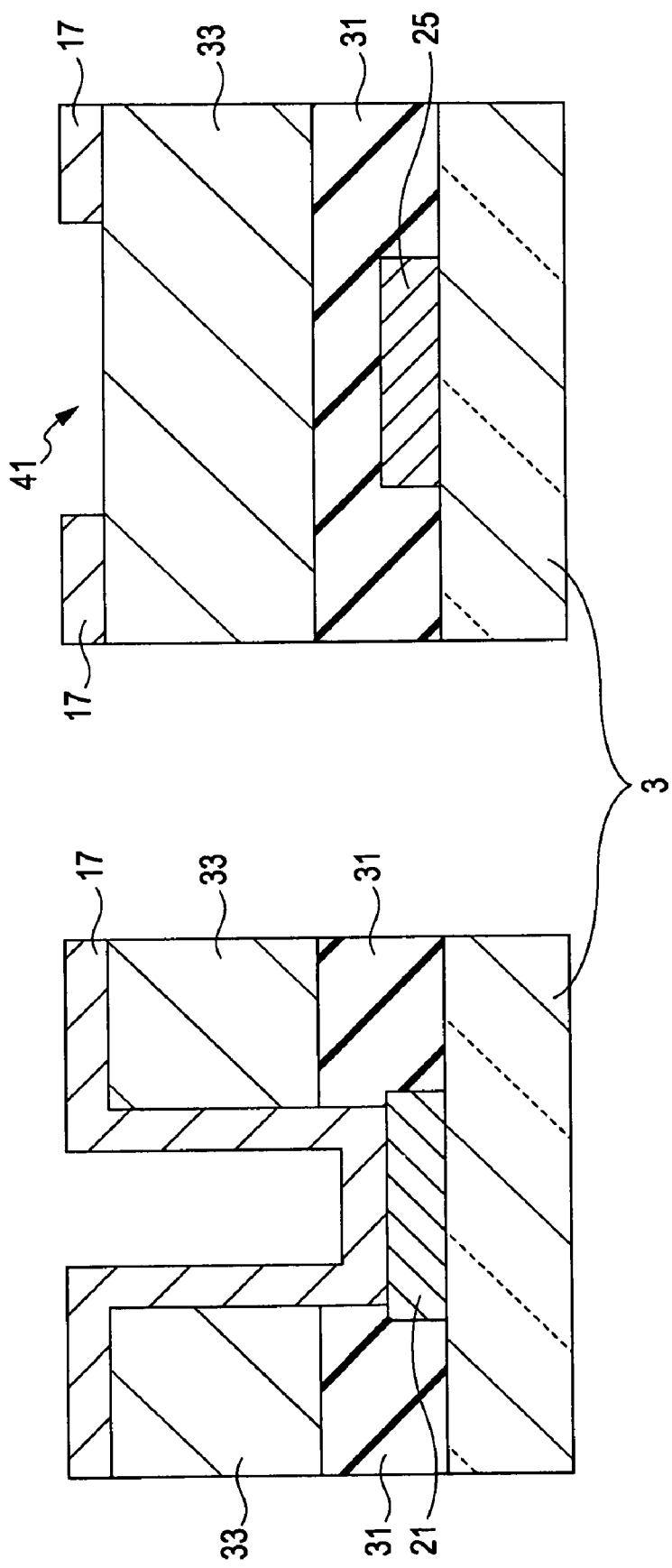
FIG. 11 explains the process of making the display panel and includes the cross sections of the parts near the power supply pads.

After that, the cathode common electrode 17 under the opening 63 is removed by etching. Consequently, the notch 41 is formed so as to downwardly extend from the opening 63 (FIG. 11).

(A-3) Advantages

The notches 41 are arranged in the cathode common electrode 17 in part where the cathode common electrode 17 overlaps the anode power supply lead pattern 25, thus reducing the probability of occurrence of a short circuit between the power supplies, the short circuit being a fatal defect caused upon occurrence of a pin hole. Advantageously, the yield of the organic EL display can be improved, thus reducing the manufacturing cost.

As for the process of making the organic EL display, it is unnecessary to change the fundamental processing steps. A step of forming the notch 41 may be added to the fundamental processing steps. Advantageously, the organic EL display can be efficiently made in terms of the making process.

(B) Modifications (B-1) Shape of Notch

The foregoing embodiment relates to the arrangement of the rectangular notches 41.

The notch 41 is not necessarily limited to the rectangular one.

Figure 12:
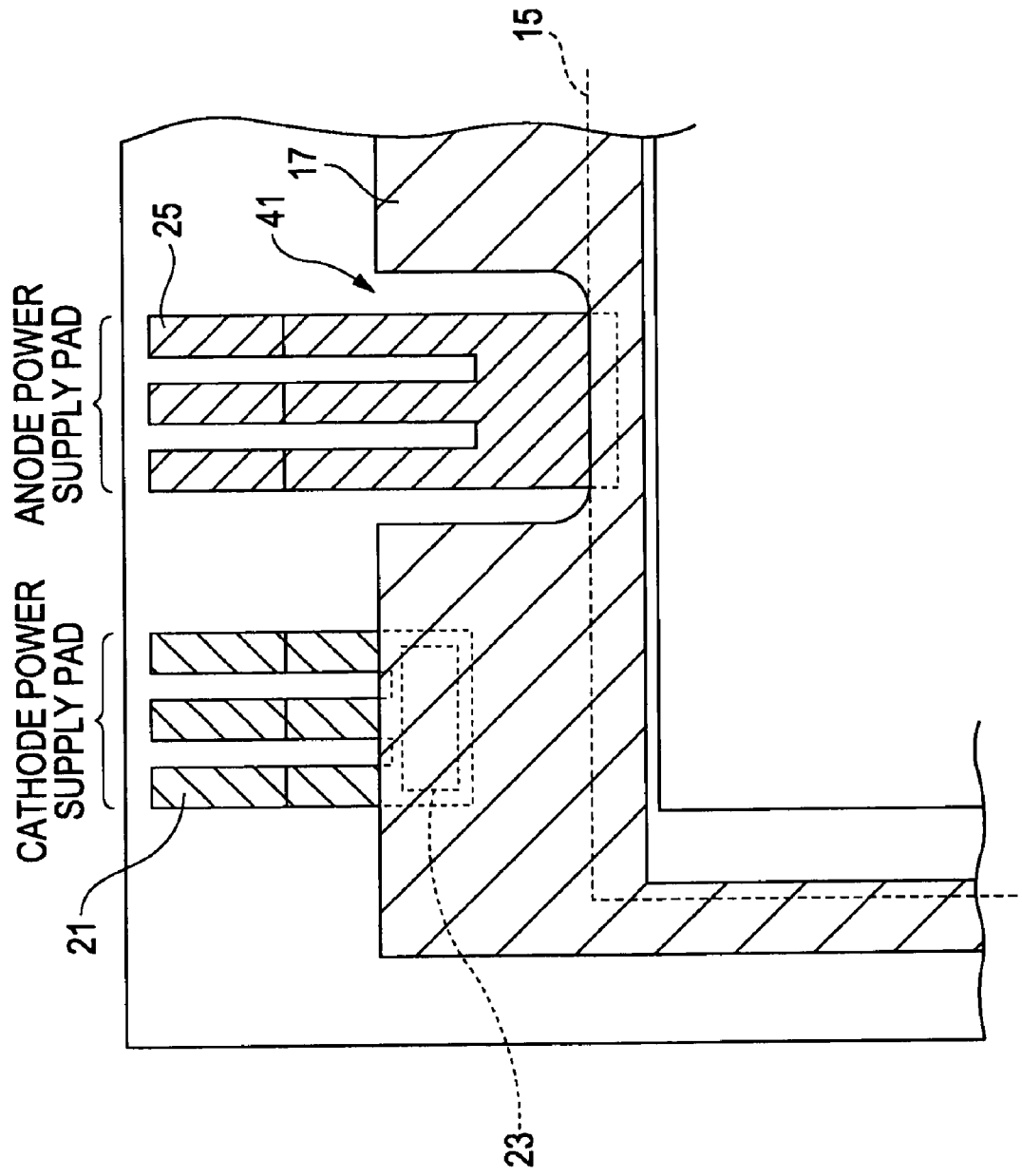
FIG. 12 is a plan view of another arrangement in the vicinity of power supply pads.

For example, the notch 41 may be rounded as shown in FIG. 12. In FIG. 12, the corners of the bottom of the notch 41 are rounded. The corners thereof at the open end may be rounded. Alternatively, all of the corners may be rounded.

Figure 13:
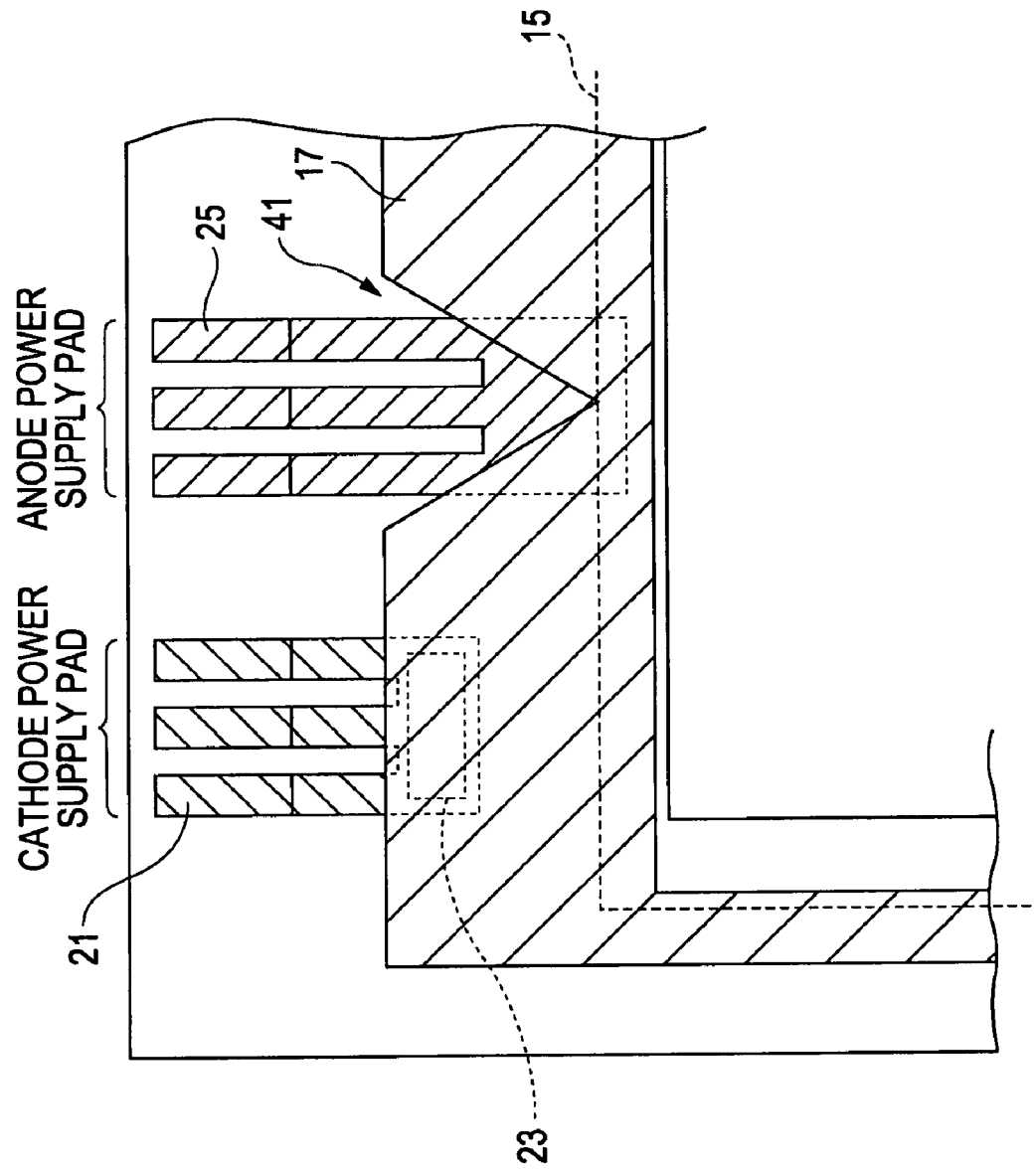
FIG. 13 is a plan view of another arrangement in the vicinity of power supply pads.

The notch 41 may be V-shaped as shown in FIG. 13. In this case, the area of overlap between the cathode common electrode 17 and the anode power supply lead pattern 25 is larger than that in FIG. 4 or that in FIG. 12 but is remarkably smaller than that in FIG. 2. Although the probability of occurrence of a short circuit between the power supplies is higher than that in the foregoing embodiment, the probability can be lower than that in the related art.

Figure 14:
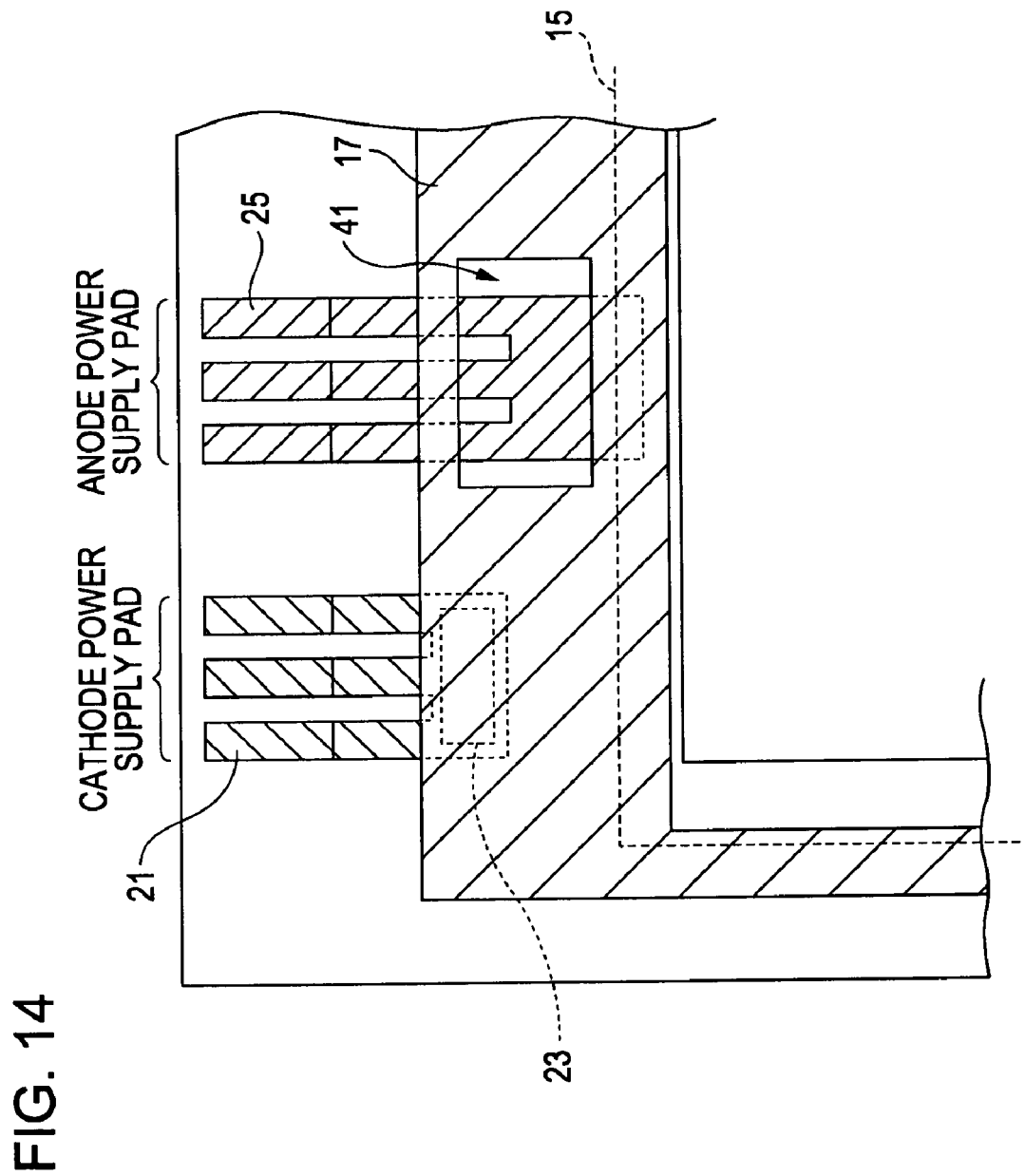
FIG. 14 is a plan view of another arrangement in the vicinity of power supply pads.

As shown in FIG. 14, a hole, also indicated at 41, may be formed by cutting a part out of the cathode common electrode 17 instead of the notch 41. In this case, the area of overlap between the cathode common electrode 17 and the anode power supply lead pattern 25 is larger than that in FIG. 4 or that in FIG. 12 but is remarkably smaller than that in FIG. 2. Although the probability of occurrence of a short circuit between the power supplies is higher than that in the foregoing embodiment, the probability can be lower than that in the related art.

Figure 15:
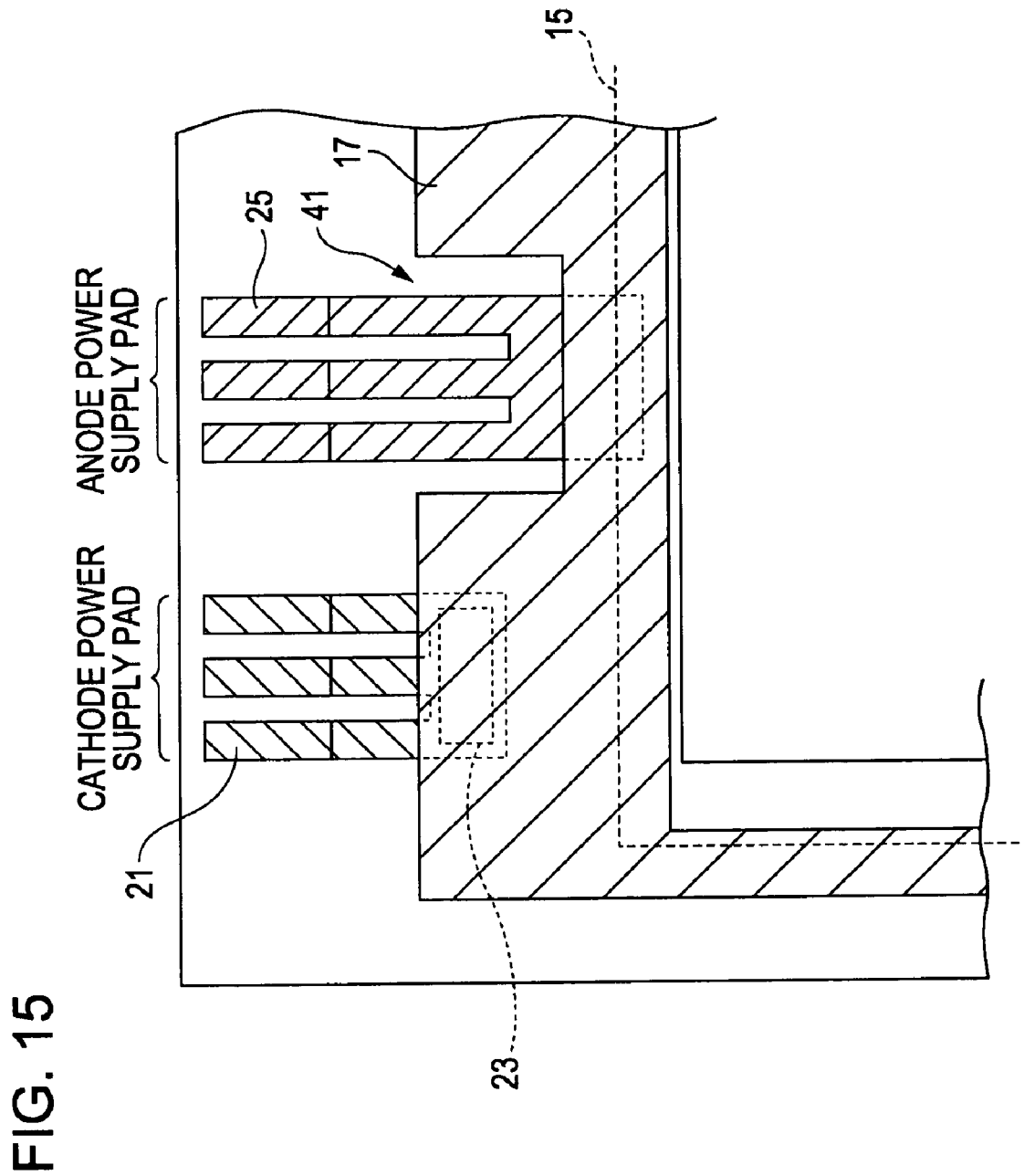
FIG. 15 is a plan view of another arrangement in the vicinity of power supply pads.

The notch 41 may be arranged so as not to reach the cathode-layer deposition area 15 as shown in FIG. 15. In this case, the area of overlap between the cathode common electrode 17 and the anode power supply lead pattern 25 is larger than that in FIG. 4 or that in FIG. 12 but is remarkably smaller than that in FIG. 2. Although the probability of occurrence of a short circuit between the power supplies is higher than that in the foregoing embodiment, the probability can be lower than that in the related art.

Figure 16:
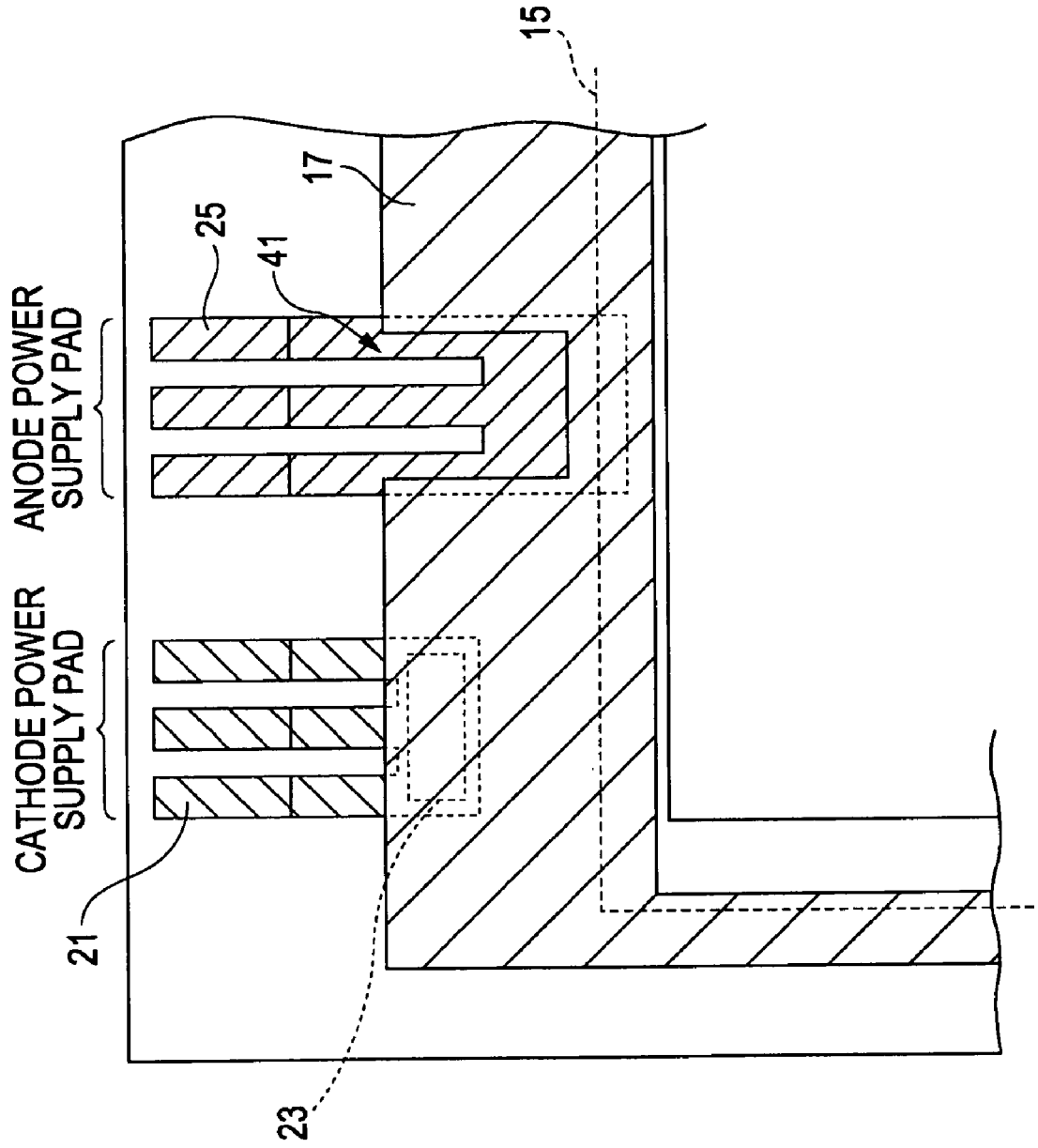
FIG. 16 is a plan view of another arrangement in the vicinity of power supply pads.

The width of the notch 41 may be narrower than that of the anode power supply lead pattern 25 as shown in FIG. 16. In this case, the area of overlap between the cathode common electrode 17 and the anode power supply lead pattern 25 is larger than that in FIG. 4 or that in FIG. 12 but is remarkably smaller than that in FIG. 2. Although the probability of occurrence of a short circuit between the power supplies is higher than that in the foregoing embodiment, the probability can be lower than that in the related art.

(B-2) Position for Formation of Notch

In the foregoing embodiment, the notch 41 is arranged in each part where the cathode common electrode 17 overlaps the anode power supply lead pattern 25 to which an anode potential is applied.

The notch 41 may be disposed in part where the cathode common electrode 17 overlaps another lead pattern to which a potential different from that applied to the cathode common electrode 17 is applied.

(B-3) Position of Layer for Common Electrode

In the foregoing embodiment, the cathode common electrode 17 is arranged over the cathode layer.

The present invention is applicable to a case where the cathode common electrode 17 is disposed under the cathode layer.

(B-4) Type of Common Electrode

In the foregoing embodiment, the common electrode is the cathode common electrode.

The present invention is applicable to a case where the common electrode is used for application of another potential.

(B-5) Applications

The foregoing embodiment relates to the organic EL display serving as a display panel module.

The organic EL display may be mounted on an electronic device and be distributed as another type of product.

Figure 17:
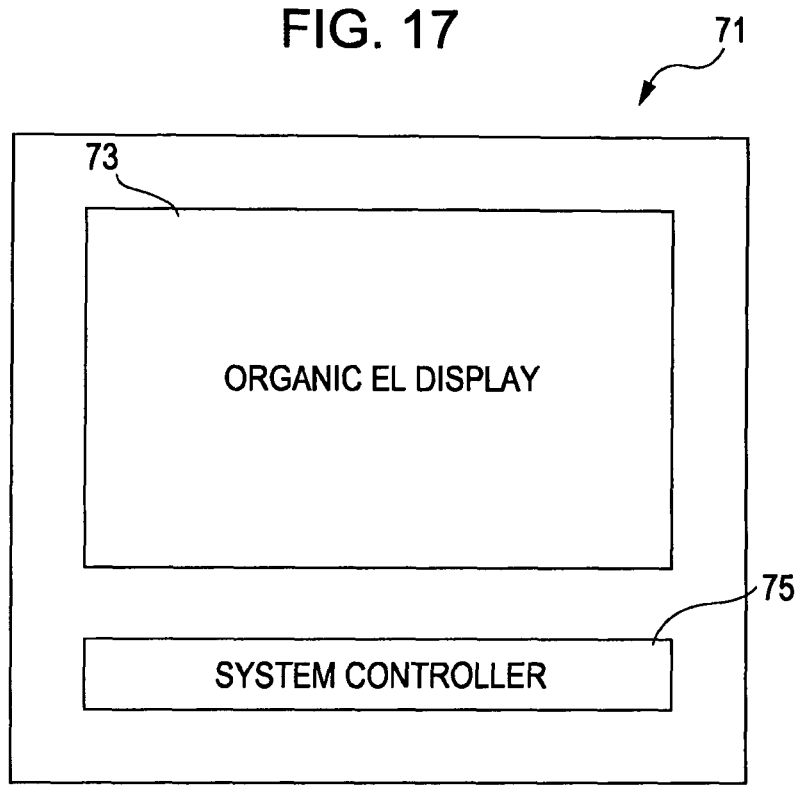
FIG. 17 is a diagram illustrating the conceptual structure of an electronic device.

FIG. 17 illustrates the conceptual structure of an electronic device 71. The electronic device 71 includes an organic EL display 73 having the above-described panel structure and a system controller 75. A process executed by the system controller 75 depends on the type of the electronic device 71.

The electronic device 71 has a function of displaying an image or a video image that is generated therein or externally supplied and is not limited to a specific field device.

Figure 18:
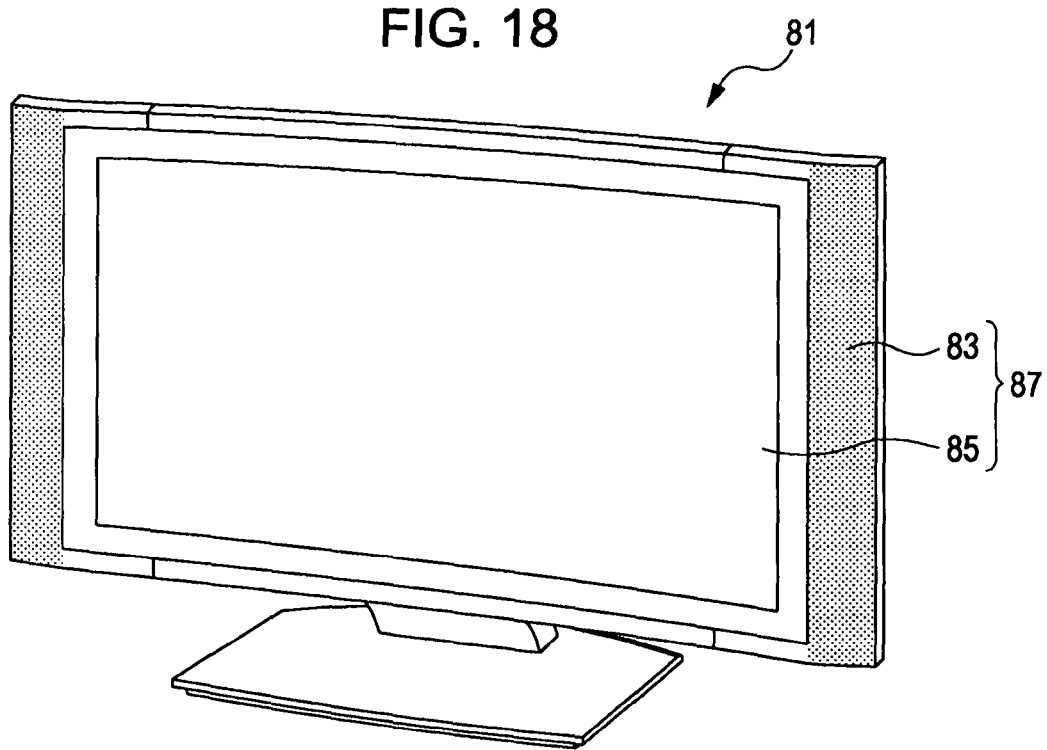
FIG. 18 is a perspective view of a television receiver.

Applications of this type of electronic device 71 include, for example, a television receiver. FIG. 18 is a perspective view of a television receiver 81.

The front surface of a housing of the television receiver 81 has a display screen 87 including a front panel 83 and a filter glass 85. The display screen 87 corresponds to the organic EL display described in the foregoing embodiment.

Figure 19A:
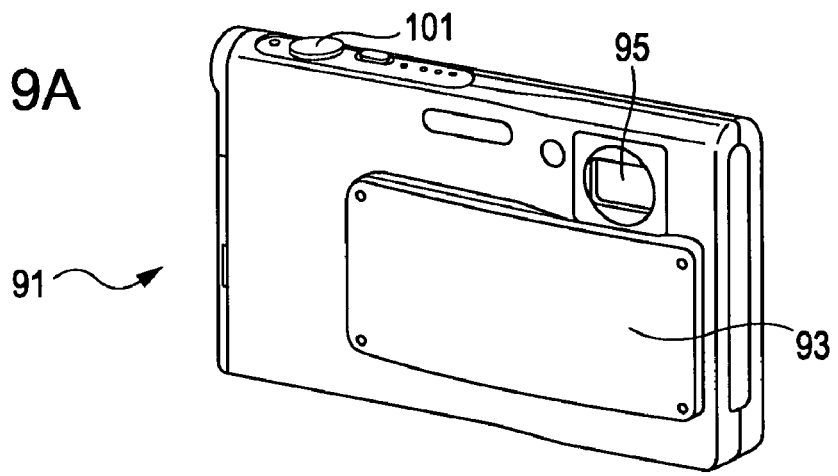
FIGS. 19A and 19B are perspective views of a digital camera.
Figure 19B:
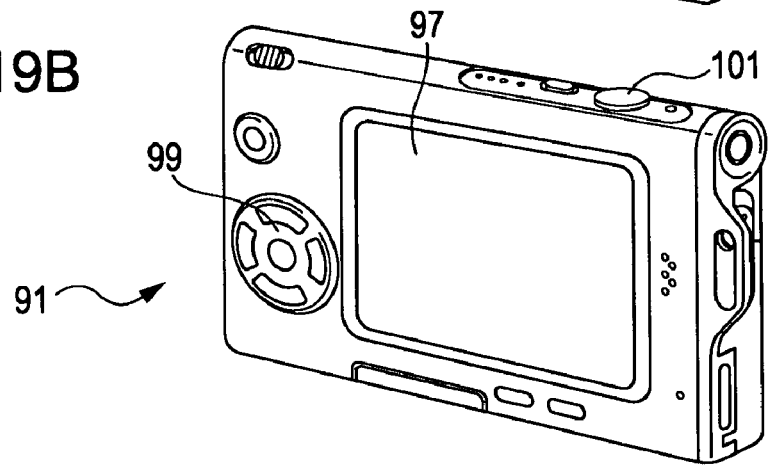

Applications of this type of electronic device 71 include, for example, a digital camera. FIGS. 19A and 19B illustrate a digital camera 91. FIG. 19A is a perspective view of the digital camera 91 viewed from the front (i.e., the side of an object). FIG. 19B is a perspective view of the digital camera 91 viewed from the rear (i.e., the side of a user or photographer).

The digital camera 91 includes an imaging lens (disposed behind a protective cover 93 since the protective cover 93 is closed in FIG. 19A), a light emitting unit 95 for flash shooting, a display screen 97, a control switch 99, and a shutter release 101. The display screen 97 corresponds to the organic EL display described in the foregoing embodiment.

Figure 20:
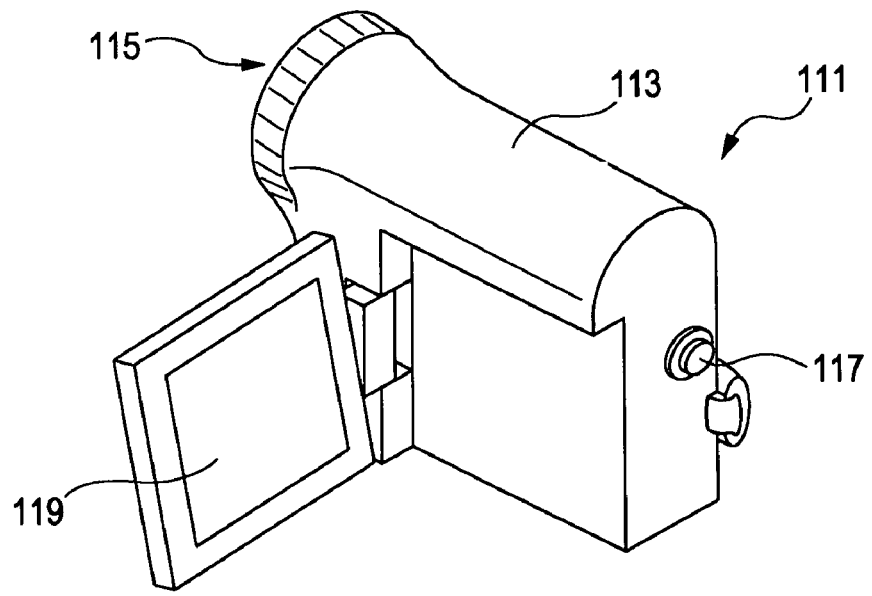
FIG. 20 is a perspective view of a video camera.

Applications of this type of electronic device 71 include, for example, a video camera. FIG. 20 is a perspective view of a video camera 111.

The video camera 111 includes a body 113, an imaging lens 115 that is disposed in the front of the body 113 and captures an image of an object, a start and stop switch 117, and a display screen 119. The display screen 119 corresponds to the organic EL display described in the foregoing embodiment.

Figure 21A:
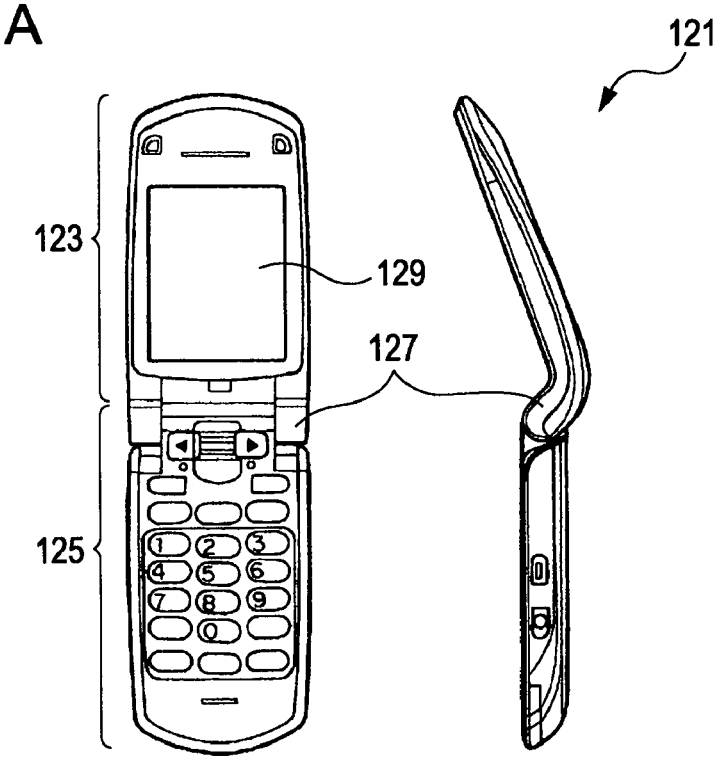
FIGS. 21A and 21B are external views of a mobile phone.
Figure 21B:
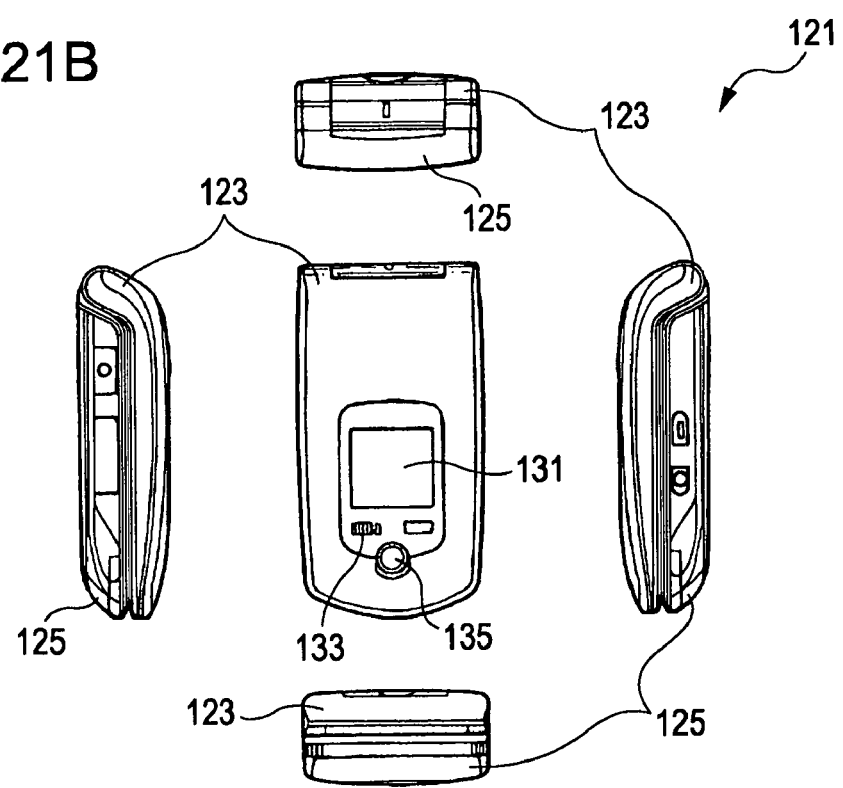

Applications of this type of electronic device 71 include, for example, a portable terminal. FIGS. 21A and 21B are external views of a foldable mobile phone 121, serving as a portable terminal. FIG. 21A illustrates the mobile phone 121 in an unfolded state. FIG. 21B illustrates the mobile phone 121 in a folded state.

The mobile phone 121 includes an upper housing 123, a lower housing 125, a connecting member (a hinge in this case) 127, a main display screen 129, a sub-display screen 131, a picture light 133, and an imaging lens 135. The main display screen 129 and the sub-display screen 131 each correspond to the organic EL display described in the foregoing embodiment.

Figure 22:
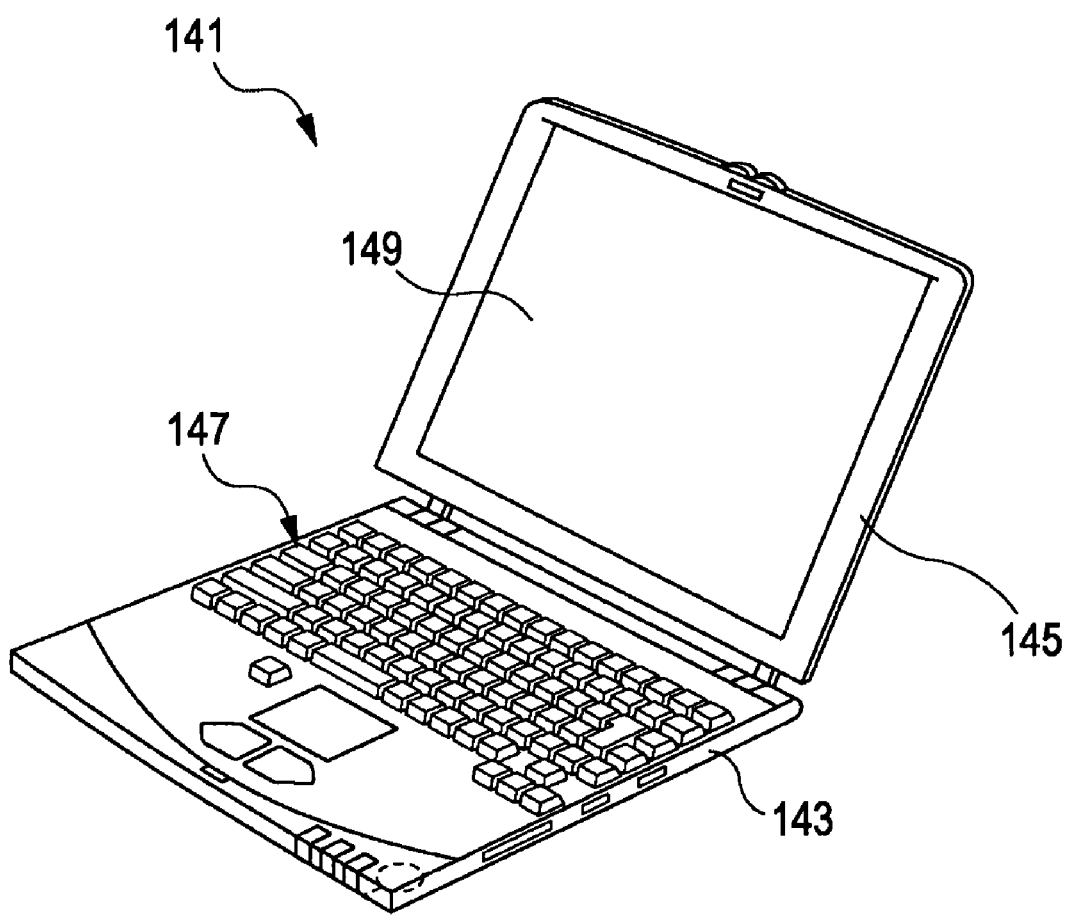
FIG. 22 is a perspective view of a computer.

Applications of this type of electronic device 71 include, for example, a computer. FIG. 22 is a perspective view of a notebook-sized personal computer 141.

The notebook-sized personal computer 141 includes a lower housing 143, an upper housing 145, a keyboard 147, and a display screen 149. The display screen 149 corresponds to the organic EL display described in the foregoing embodiment.

Other applications of this type of electronic device 71 include, for example, an audio player, a game console, an electronic book, and an electronic dictionary.

(B-6) Other Displays

The foregoing embodiment has been described with respect to the organic EL display, serving as a display device.

The present invention can be applied to other self-light-emitting displays, such as an inorganic EL display and an LED display.

It should be understood by those skilled in the art that various modifications, combinations, sub-combinations and alterations may occur depending on design requirements and other factors insofar as they are within the scope of the appended claims or the equivalents thereof.

What is claimed is:

1. A display panel, comprising:
    a display area with a matrix array of display pixels;
        an electrode arranged so as to cover at least substantially the whole of the display area; and
        a common electrode electrically connected to the electrode, the common electrode being frame-shaped and being arranged around a periphery of the display area, wherein
        the common electrode has a notch that is opposed to a power supply lead pattern to which a potential different from that applied to the common electrode is applied, wherein the notch is a portion of the common electrode having a width that is substantially reduced relative to a width of the common electrode in remaining portions around the periphery of the display.

2. The display panel according to claim 1, wherein the notch is arranged so that a portion of the common electrode covering the power supply lead pattern is substantially reduced.

3. The display panel according to claim 1, wherein the notch has a rectangular shape.

4. The display panel according to claim 3, wherein the notch is rounded.

5. The display panel according to claim 1, wherein the notch is V-shaped.

6. The display panel according to claim 1, wherein notch is substantially centrally located in the common electrode such that only innermost and outermost portions of the common electrode extend across the power supply lead pattern.

7. The display panel according to claim 1, wherein the common electrode is a cathode common electrode and the power supply lead pattern to which a potential different from that applied to the common electrode is applied is an anode power supply lead pattern.

8. The display panel according to claim 1, wherein the display pixels each comprise a light-emitting pixel including an organic electroluminescent element and a drive circuit.

9. An electronic device including a display panel and a system controller, the display panel having a display area with a matrix array of display pixels, wherein
the display panel includes
an electrode arranged so as to cover the whole of the display area, and
a common electrode electrically connected to the electrode, the common electrode being frame-shaped and being arranged along the periphery of the display area, and
the common electrode has a notch that is opposed to a power supply lead pattern to which a potential different from that applied to the common electrode is applied a display area with a matrix array of display pixels, wherein the notch is a portion of the common electrode having a width that is substantially reduced relative to a width of the common electrode in remaining portions around the periphery of the display.

10. A method of making a display panel having a display area with a matrix array of display pixels, the method comprising the steps of:
forming an electrode so as to cover the whole of the display area; and
forming a common electrode electrically connected to the electrode such that the common electrode is frame-shaped and is arranged along the periphery of the display area, and the common electrode has a notch that is opposed to a power supply lead pattern to which a potential different from that applied to the common electrode is applied, wherein the notch is a portion of the common electrode having a width that is substantially reduced relative to a width of the common electrode in remaining portions around the periphery of the display.

* * * * *